United States Patent [19]

Benz et al.

[11] Patent Number: 5,436,406
[45] Date of Patent: Jul. 25, 1995

[54] INSTRUMENT HOUSING

[75] Inventors: H. Bernd Benz, Baden-Baden; Paul Mazura, Karlsbad/Langensteinbach; Hans M. Schwenk, Straubenhardt, all of Germany

[73] Assignee: Schroff GmbH, Staubenhardt, Germany

[21] Appl. No.: 68,600

[22] Filed: May 17, 1993

[30] Foreign Application Priority Data

May 18, 1992 [DE] Germany .................. 42 16 350.1

[51] Int. Cl.[6] .............................................. H05K 5/03
[52] U.S. Cl. ................................................... 174/50
[58] Field of Search .................. 174/50; 361/752, 796, 361/801, 802, 816, 818; 220/4.02

[56] References Cited

U.S. PATENT DOCUMENTS

| | | | |
|---|---|---|---|
| 2,379,189 | 6/1945 | Rupp | 174/35 MS X |
| 4,264,800 | 4/1981 | Jahnke et al. | 174/35 MS X |
| 4,433,204 | 2/1984 | Wuertz | 174/48 |
| 4,559,428 | 12/1985 | Takeuji | 174/35 MS X |
| 4,766,519 | 8/1988 | Heiland | 220/4.02 X |
| 4,901,200 | 2/1990 | Mazura | |
| 5,004,866 | 4/1991 | Cooke et al. | 174/34 MS X |
| 5,223,670 | 6/1993 | Hogan et al. | 174/35 MS |

FOREIGN PATENT DOCUMENTS 0311702  4/1989  European Pat. Off. .
8703138  5/1987  Germany .

Primary Examiner—Leo P. Picard
Assistant Examiner—Paramita Ghosh
Attorney, Agent, or Firm—Spencer, Frank & Schneider

[57] ABSTRACT

An instrument housing for industrial electronic systems includes a closed body provided with a front opening. An exchangeable frontal frame having a U-shaped profile is provided at the front opening and is equipped with a covering strip provided with a step and with a flashing strip provided with a groove as well as with shaped-on pins for fastening it to a frame strip of the body. If the frontal frame is attached, the step sealingly grips around the edge formed by the frame strip and the body, and an angled knife-edge strip attached at an acute angle to the frame strip of the body engages into the groove.

11 Claims, 2 Drawing Sheets

5,436,406

INSTRUMENT HOUSING

CROSS REFERENCE TO RELATED APPLICATION

This application claims the priority of application Ser. No. P 42 16 350.1, filed May 18th, 1992, in the Federal Republic of Germany, the subject matter of which is incorporated herein by reference.

BACKGROUND OF THE INVENTION

The present invention relates to an instrument housing for industrial electronic systems, the housing including a steel sheet body intended to accommodate electronic units and provided with a front opening, a continuous frame strip extending inwardly at a right angle from the front opening so as to form an edge with the body, an outwardly oriented continuous knife-edge strip angled from the frame strip as well as a closed rectangular frontal frame attached to the front opening, seated ahead of the frame strip and the knife-edge strip and being provided with two long and two short lateral legs.

The proposed instrument housing is employed with different dimensions for independent table model instruments.

Instrument housings including a closed body and an attached frontal frame are known in various embodiments. To accommodate the electronic components, supporting elements and inserts for modules and circuit boards are provided within the body (EU-A1-0,311,702). However, in these housings the frontal frames can either not be exchanged at all or only in a very complicated manner; the unavoidable protection against the penetration of dust and splashed water is hardly ensured or is lost when the frontal frame is exchanged.

A branch-off box for electrical devices, particularly for electrical lines, is known which is protected against water sprays and is configured to be secure against access. One region of the upper portion of the housing is closed by a specially configured cover. As a seal, the upper housing portion is provided with an outwardly oriented knife-edge strip which follows at a right angle an inwardly projecting strip. A short web is provided at the cover, whose border profile has the shape of an L. The web is provided with a groove in which a seal is seated. With the cover closed, the knife-edge strip engages in the groove. However, this housing configuration, which does not include a frontal frame, is not suitable for use in conjunction with instrument housings for industrial electronic systems (German Utility Model Patent DE-GM 87/03,138).

SUMMARY OF THE INVENTION

It is an object of the present invention to develop an instrument housing in which it is possible to easily exchange the frontal frame in order to adapt it to different industrial requirements and given standards while maintaining the type of protection selected for the housing.

The solution of the problem at hand is based on an instrument housing of the above-described type and is accomplished by the present invention in that the frontal frame essentially has a U-shaped profile whose U-legs extend approximately parallel. The frontal frame includes an outer covering strip which forms the longer leg of the U and is provided with a step near its border to grip around the edge formed by the frame strip and the body. The frontal frame is provided with a flashing strip which constitutes the shorter leg of the U and is provided at its free border with a groove into which the knife-edge strip engages.

The proposed configuration of the borders of the covering strip and of the flashing strip of the frontal frame ensures not only the desired exchangeability but also an excellent seal between the body of the instrument housing and the frontal frame.

It is particularly advantageous for the outer covering strip and the inner flashing strip to be provided on all sides of the frontal frame.

According to an advantageous modification of the invention, the knife-edge strip forms an acute angle with the frame strip. Thus, an approximately V-shaped channel is formed which is able to collect water splashed in from the cover of the body and conduct it away on the side.

The inner flashing strip may be provided with an outwardly directed abutment strip. The latter serves as a lining for a pivotal door of sheet metal, plastic or glass disposed at the frontal frame.

Between the flashing strip and the abutment strip a trough may be provided which serves as a holding device for a sealing or decorative strip.

If the instrument housing or, more precisely, its frontal frame, is equipped with a door, a continuous elastic sealing lip will advantageously be inserted into the groove formed by the flashing strip and the abutment strip and will rest against the interior of the groove when the door is closed.

In order to fasten the frontal frame to the body of the instrument housing, the frontal frame is advisably provided with a plurality of fastening elements disposed between its covering strip and the flashing strip, and the frame strip is provided with fastening means that correspond with these fastening elements.

Advisably pins shaped to the rear of the frontal frame project as fastening elements for the frontal frame so as to engage in holes in the frame strip serving as fastening means.

The pins are advisably provided with screw threads at their ends. These screw threads pass through the holes and are provided with fastening nuts on the rear of the frame strip. Instead of a screw thread, a smooth, cylindrical end may also be provided onto which a resilient locking disk is placed.

Particularly for instrument housings of smaller dimensions, the frontal frame is advisably made of one piece and is an injection molded component made of plastic or metal.

For the purpose of economy, the frontal frame may be composed of two identical long U-profiles and two identical short U-profiles. The two ends of the long U-profiles may be angled.

BRIEF DESCRIPTION OF THE DRAWINGS

The present invention will now be described in greater detail for two embodiments thereof which are illustrated in the attached two drawing sheets, in which.

DETAILED DESCRIPTION OF THE PREFERRED EMBODIMENTS

Figure 1:
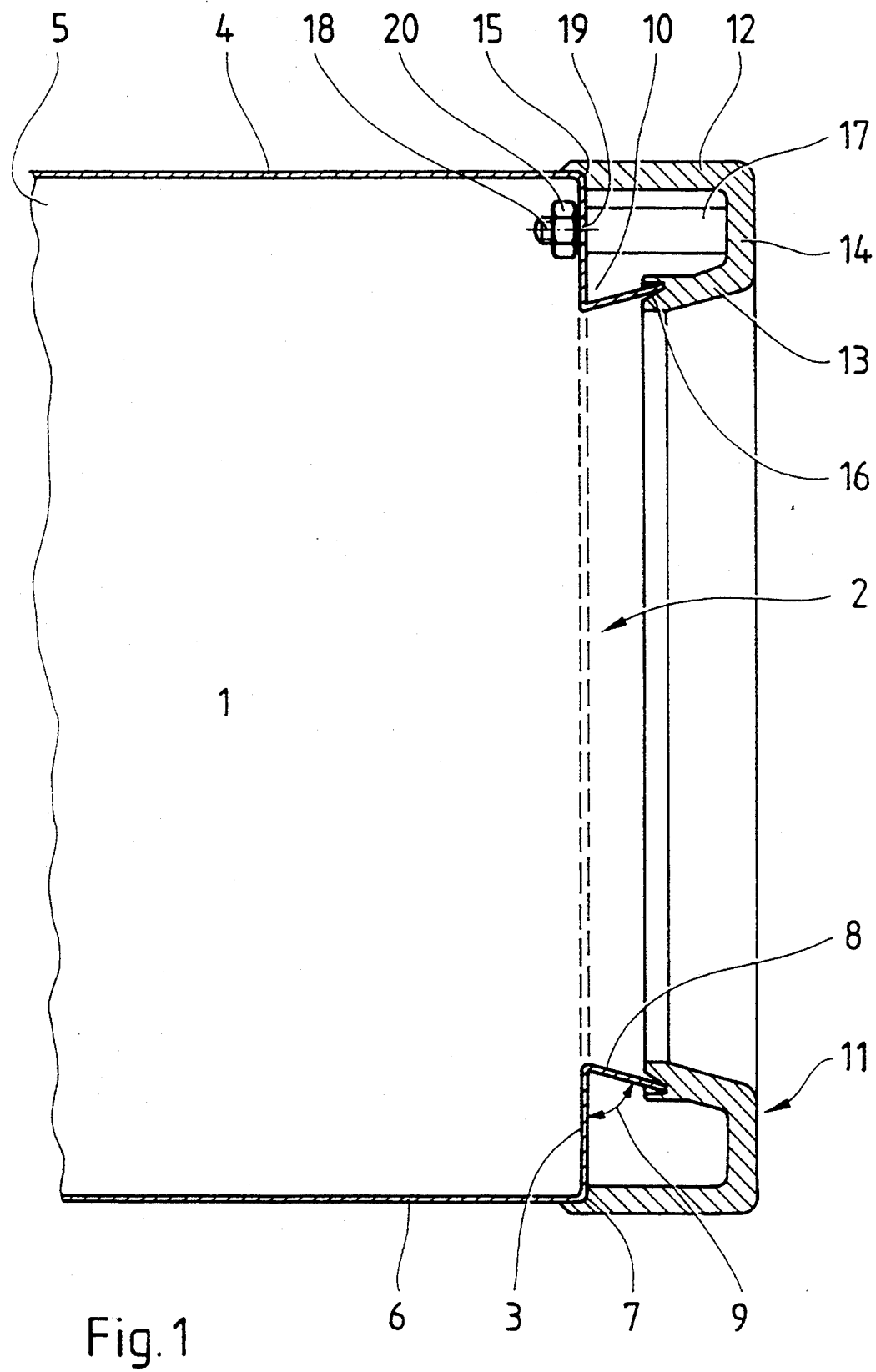
FIG. 1 is a vertical sectional view of a an instrument housing including a first embodiment of a frontal frame, with the rear housing portion being cut away.

The illustrated instrument housing for industrial electronic systems includes a block-shaped body 1 made of thin steel sheet and serving to accommodate electronic components. To hold these components, the body is provided with several fastening rails, supporting elements and other non-illustrated holding elements at its bottom and side walls. Body 1 is completely closed on all sides except for a rectangular front opening 2 through which the interior of body 1 is accessible for the insertion of the components.

A frame strip 3 is provided at front opening 2. This continuous frame strip 3 is attached or shaped onto body 1 so as to extend inwardly at a right angle. Frame strip 3 and body 1, that is, its top, the two side walls 5 and its bottom 4 [sic], forms a rectangular, continuous edge 7.

Frame strip 3 is followed by an outwardly projecting knife-edge strip 8. The latter is also shaped on and is inclined at an acute angle 9 relative to frame strip 3. This creates a low channel 10 with a V-shaped cross section between frame strip 3 and knife-edge strip 8 which conducts water possibly penetrating in from the top away in the direction toward side walls 5.

A closed, rectangular frontal frame 11 is attached to front opening 2 and is seated in front of frame strip 3 and knife-edge strip 8 so as to cover them. This frontal frame 11 has two upper and lower long legs that are parallel to top 4 and bottom 6 and two short lateral legs that are parallel to sides 5 of body 1. Frontal frame 11 may be an injection-molded plastic component or an injection-molded metal component.

Frontal frame 11 has essentially a U-shaped profile whose two U legs extend parallel to one another and have unequal lengths. Frontal frame 11 is formed of an outer covering strip 12 which forms the one leg of the U, and a flashing strip 13, which forms the other leg of the U of the U-shaped profile. Covering strip 12 and flashing strip 13 are connected with one another by way of a front strip 14 that can be considered the base of the U.

The outer covering strip 12 of frontal frame 11 is provided with a rectangular step 15 near its border which grips around the edge 7 formed by frame strip 3 and body 1 and produces a labyrinth seal therewith that makes the penetration of sprayed or splashed water into the instrument housing more difficult.

The inner flashing strip 13 of frontal frame 11 is provided with a V-shaped groove 16 at its free border. The outer border of knife-edge strip 8 of body 1 engages in this groove 16.

Covering strip 12 and flashing strip 13 are provided not only at the two upper and lower legs (parallel to top 4 and bottom 6) of frontal frame 11, but also at the two short legs of frontal frame 11 that lie parallel to the two sides 5 of body 1.

Frontal frame 11 is releasably fastened to body 1. Fastening elements in the form of shaped-on cylindrical pins 17 that project at the interior face of frontal frame 11 and are disposed between covering strip 12 and flashing strip 13 are provided for this purpose. These pins 17 are equipped with screw threads 18 at their ends that pass through corresponding fastening means in the form of holes 19 in frame strip 3 and are equipped with fastening nuts 20.

Figure 2:
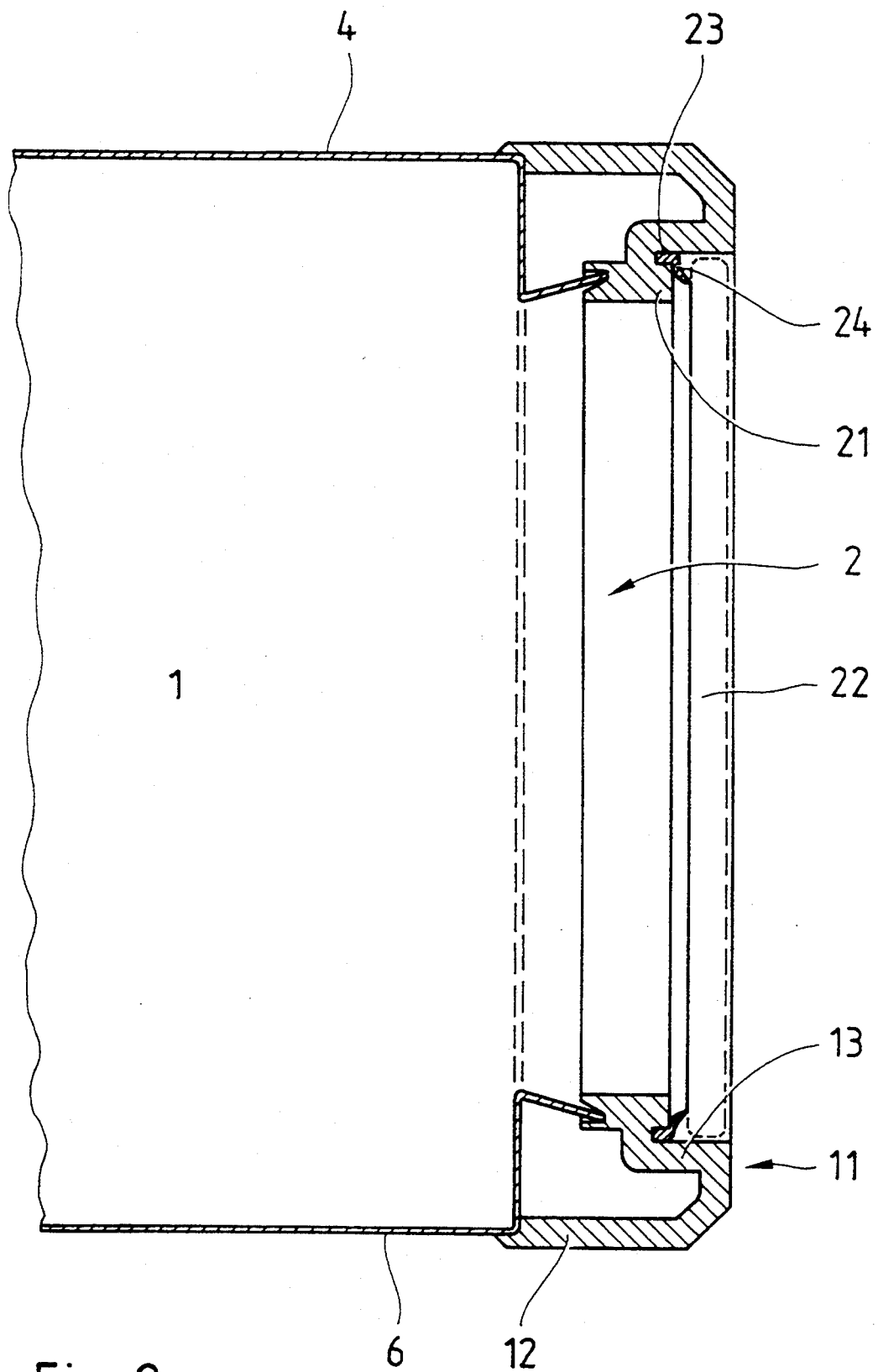
FIG. 2 is a vertical sectional view of the instrument housing of FIG. 1 including a second embodiment of the frontal frame, with the rear housing portion again being cut away.

The instrument housing whose frontal portion including front opening 2 is shown in FIG. 2 is substantially identical to the housing shown in FIG. 1. However, the inner flashing strip 13 of frontal frame 11 is provided with an outwardly oriented abutment strip 21 for a door 22—for example, a glass door—that is indicated by dashed lines.

A trough 23 having a rectangular cross section is provided between abutment strip 21 and flashing strip 13, with an elastic sealing lip 24 being pressed into the trough. If door 22 is closed, this sealing lip 24 places itself sealingly against the border of door 22 from the rear.

Frontal frame 11 may be manufactured in one piece, at least for instrument housings of smaller dimensions. This frontal frame 11, however, may also be composed of two identically configured long U-profiles and two correspondingly configured short U-profiles which are connected with one another without tools or special devices with the aid of plug-in or snap-in connections.

It will be understood that the above description of the present invention is susceptible to various modifications, changes and adaptations, and the same are intended to be comprehended within the meaning and range of equivalents of the appended claims.

What is claimed is:

1. An instrument housing for industrial electronic systems, comprising
   a body to accommodate insertable electronic units and provided with a front opening;
   a continuous frame strip that extends inwardly at a right angle to the front opening and forms an edge with the body;
   an outwardly oriented continuous knife-edge strip that follows the frame strip after at an acute angle therewith;
   a closed, rectangular frontal frame attached to the front opening, seated in front of the frame strip and the knife-edge strip and equipped with two long lateral legs and two short lateral legs, wherein
   the frontal frame has an essentially U-shaped profile whose U-legs extend approximately parallel to one another;
   the frontal frame grips around an outer covering strip constituting the longer U leg, with a step being provided near the border of the covering strip to grip around the edge formed by the frame strip and the body; and
   the frontal frame is provided with an inner flashing strip that forms the shorter U-leg and is provided at its free border with a groove into which engages the knife-edge strip.

2. An instrument housing as defined in claim 1, wherein the outer covering strip and the inner flashing strip are provided on all sides of the frontal frame.

3. An instrument housing as defined in claim 1, wherein the inner flashing strip is provided with an outwardly oriented abutment strip.

4. An instrument housing as defined in claim 3, wherein a trough is provided between the flashing strip and the abutment strip.

5. An instrument housing as defined in claim 4, wherein an elastic sealing lip is inserted into the trough.

6. An instrument housing as defined in claim 1, wherein the frontal frame is provided with fastening elements disposed between the cover strip and the flashing strip and the frame strip is provided with fastening means that correspond to the fastening elements.

7. An instrument housing as defined in claim 6, wherein shaped-on pins project as fastening elements so as to engage in holes serving as fastening means.

8. An instrument housing as defined in claim 7, wherein the ends of the pins are provided with screw threads which penetrate the holes and are provided with fastening nuts.

9. An instrument housing as defined in claim 1, wherein the frontal frame is a plastic injection-molded component.

10. An instrument housing as defined in claim 1, wherein the frontal frame is a metal injection-molded component.

11. An instrument housing as defined in claim 1, wherein the frontal frame is assembled of two identically configured long U-profiles and two identically configured short U-profiles.

* * * * *